United States Patent [19]

Floury et al.

[11] 4,351,468
[45] Sep. 28, 1982

[54] APPARATUS FOR WIRING CONNECTIONS ON A SUBSTRATE

[75] Inventors: Claude P. Floury; Claude L. J. M. Guillet, both of Angers; James A. Lokocki, Montreuil Juigne; Maurice R. Devoille, Rochefort Sur Loire; Bernard Fanene, Prelaze, all of France

[73] Assignee: Compagnie Internationale pour l'Informatique CII-Honeywell Bull, Paris, France

[21] Appl. No.: 188,020

[22] Filed: Sep. 17, 1980

[30] Foreign Application Priority Data

Sep. 28, 1979 [FR] France .................. 79 24290

[51] Int. Cl.³ .............................................. B23K 1/00
[52] U.S. Cl. ..................................... 228/4.5; 29/850; 156/548; 219/56.1
[58] Field of Search ..................... 228/4.5, 18; 29/850; 219/56.1, 56.21; 156/547, 548, 550, 551

[56] References Cited

U.S. PATENT DOCUMENTS

| 3,192,358 | 6/1965 | Lasch, Jr. et al. | 228/4.5 |
| 3,289,452 | 12/1966 | Kollner | 228/4.5 X |
| 3,646,307 | 2/1972 | Hazel | 219/80 |
| 3,734,386 | 5/1973 | Hazel | 228/4.5 |

FOREIGN PATENT DOCUMENTS 2400304 of 0000 France .
1352558 of 0000 United Kingdom .

Primary Examiner—Howard N. Goldberg
Assistant Examiner—Fred A. Silverberg
Attorney, Agent, or Firm—Lowe, King, Price & Becker

[57] ABSTRACT

The surface of a substrate, particularly a multi-layer substrate, is wired by an apparatus including a tool carrier and a substrate carrier. The substrate carrier is positioned in a substantially horizontal plane so it is situated opposite the tool carrier. The substrate carrier is displaced relative to the tool carrier in the horizontal plane, i.e., relative to the vertical plane. A heating element and an electric wire dispenser are carried by the tool carrier. The dispenser includes a wire outlet orifice situated close to an end of the heating element. The heating element is longitudinally translated within a sleeve having an axis directed toward the substrate carrier. A rotary support carrying the dispenser is rotatable around the sleeve axis to enable the wire outlet orifice to be positioned with respect to the end of the heating element as a function of the relative displacement between the substrate carrier and tool carrier.

33 Claims, 10 Drawing Figures

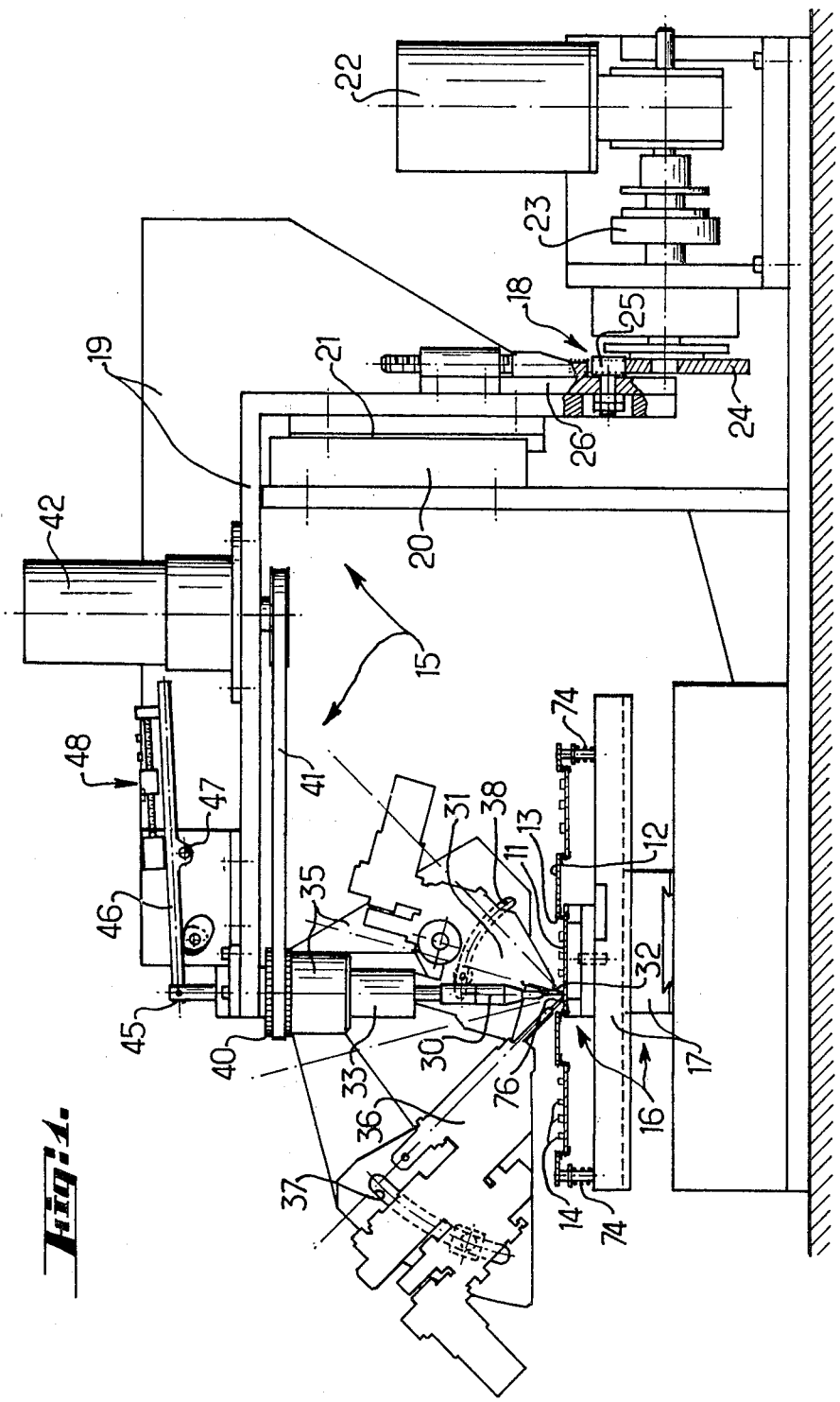

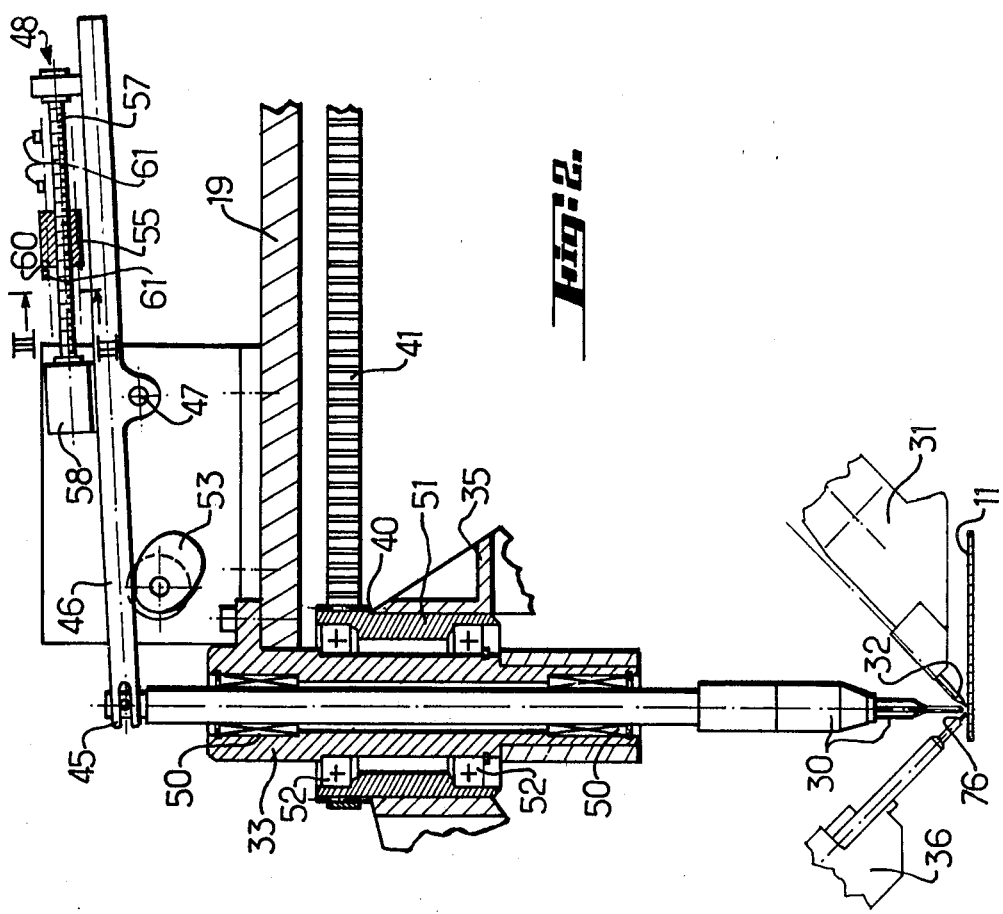
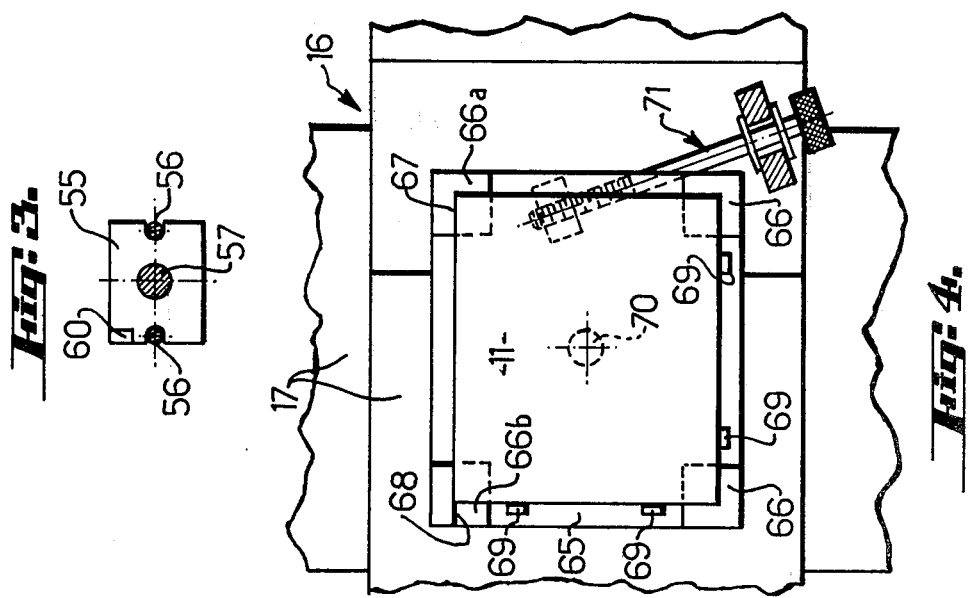

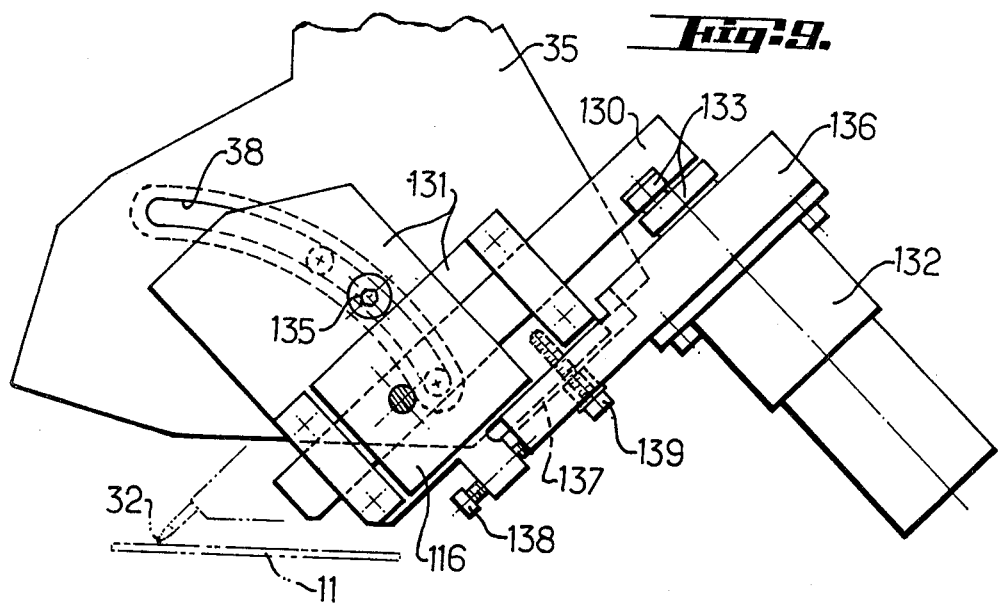
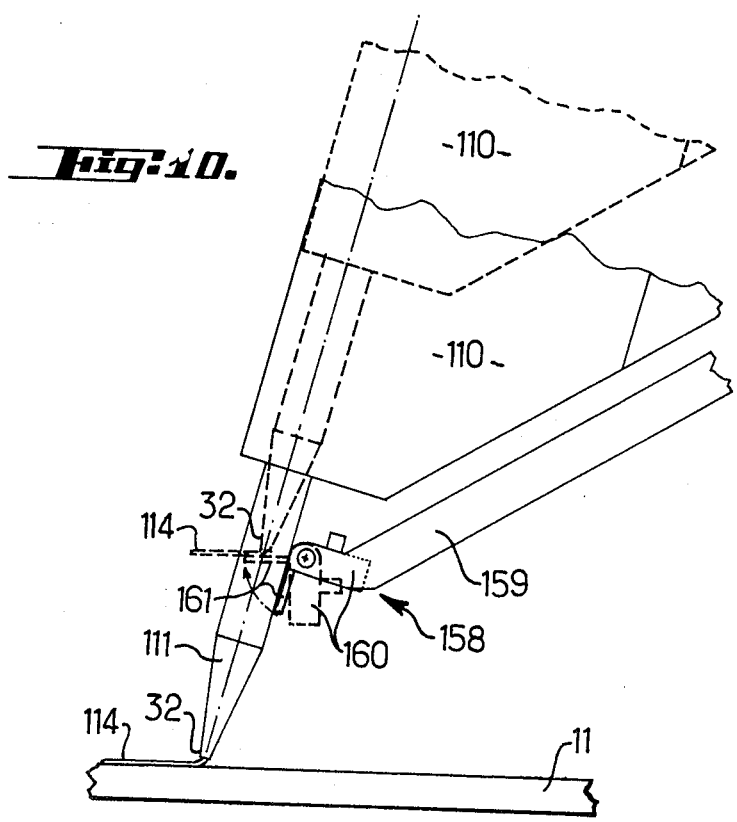

APPARATUS FOR WIRING CONNECTIONS ON A SUBSTRATE

TECHNICAL FIELD

The present invention relates generally to apparatus for wiring the surface of an interconnection board forming a substrate and, more particularly, to a dispenser for paying electric wire onto the substrate in combination with a heating element or a bit for enabling the dispensed wire to be soldered to elements on the substrate.

BACKGROUND ART

Electronic circuits, particularly digital logic circuits used in computers, have been extensively miniaturized, and continue to be miniaturized. In digital computer logic circuits, multi-layer wiring systems are frequently employed. The multi-layer wiring systems include integrated circuits containing active components which perform required logic functions. The integrated circuits are mounted on the surface of a ceramic plate, generically termed a substrate, carrying conductors that establish different interconnections between access terminals of different integrated circuits. The substrate, in addition to carrying integrated circuits, frequently carries other components, particular capacitors, having dimensions larger or smaller than those of the integrated circuits. The conductors are generally referred to as printed circuit conductors and are deposited on the substrate by a serigraphy, i.e., silk screen, process. Occasionally, a substrate must undergo wiring modifications, either during or after production.

The substrate structure is so devised that any wiring modification may be made by acting only on external connection layers of the substrate, as the external layer is the only layer which is readily available. Thus, it is not possible to modify the internal substrate layer of a multi-layer wiring system. To enable the wiring to be modified, all components mounted on the substrate have access terminals connected only to the external layer. Thus, it is possible to modify the wiring of the multi-layer wiring by isolating particular parts of a previously existing interconnection circuit of the multi-layer wiring. To sever a conductor from the external interconnection layer of the substrate in such a manner that one of the access terminals of an integrated circuit is completely isolated without deteriorating the remainder of the wiring system and/or active components implanted on the substrate, the apparatus disclosed in the copending, commonly assigned application of Maurice Devoille, entitled "Method of And Apparatus For Severing Printed Circuit Conductors" was devised. The present invention is directed to an apparatus for and method of placing complementary circuit elements on the surface of a substrate, to modify the wiring system carried by the substrate.

With existing machines, it is possible to solder a stripped end of an insulated wire to a surface of a conventional printed circuit board. With the prior art machines, the wire is applied to the board in a path between two terminals which are to be electrically connected and are firmly attached to the board. The electro-mechanical machines of the prior art have been found unsuitable and too imprecise to be adaptable, without fundamental alteration, to produce an analogous wiring system on a multi-layer substrate of a few square centimeters. One of the problems with the prior art devices is that they are incapable of handling wire of the order of a few hundredths of a millimeter in diameter, as employed in complementary multi-layer wiring systems. The machine in accordance with the present invention has been developed to handle such wiring chores.

It is, accordingly, an object of the present invention to provide a new and improved apparatus for modifying and/or completing printed circuit wiring applied to printed circuit boards which carry substrates for integrated circuits and other micro-miniaturized components.

THE INVENTION

In accordance with the present invention, an apparatus for modifying and/or completing a printed circuit that carries a substrate, particularly a multi-layer substrate, includes a tool carrier and a substrate carrier. The tool carrier includes a heating element or bit and a dispenser for electric wire that is applied to the substrate and/or board. The wire dispenser includes an orifice situated close to the end of the heating element, selectively in proximity to the substrate carrier. The heating element is longitudinally displacable within a sleeve having an axis directed toward the substrate carrier. The dispenser is rotatably mounted around the sleeve axis, to allow the wire orifice to be positioned with respect to the end of the heating element. The tool carrier and substrate carrier are mechanically coupled to each other so that the wire orifice is positioned with respect to the end of the heating element as a function of the direction of displacement between the tool carrier and substrate. In particular, the substrate carrier is horizontally positioned and situated opposite the tool carrier, so that at least one of the carriers or a part thereof is coupled to a translatory and/or rotary displacement mechanism that couples the substrate and tool carriers together.

To establish a given electrical connection on the printed circuit board, the end of a wire projecting out of the wire dispensing orifice is soldered to a first connection point. Then, a section of wire is unwound onto the surface of the substrate, as it is adhered or glued to the substrate. The unwinding operation occurs as the dispenser is moved relative to the substrate, until the wire has been payed to a second connection point. At the second connection point, the wire is soldered and then severed from a roll on which it is wound. Thus, the apparatus of the invention also includes a means mounted on the previously mentioned rotary support for securing the wire to the substrate. The wire securing means can take different configurations, depending upon whether the wire is secured to a bare substrate or to a substrate on which active and passive components have been previously mount.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIG. 1 is an overall view in elevation, with parts broken away, of an apparatus in accordance with the invention;

FIG. 2 is a view, in partial cross-section to enlarged scale, of a part of the apparatus of FIG. 1 of the heating element and of the actuating mechanism therefor;

FIG. 3 is a cross-section through lines III—III of FIG. 2;

FIG. 4 is a partial view from above wherein the general arrangement of the substrate carrier is diagrammatically shown;

FIG. 9 is a view similar to FIG. 7 wherein a part of the dispenser (shown by dashed lines) is assumed to have been removed; and FIG. 10 is a diagrammatical view to enlarged scale of a part of FIG. 7 wherein a wire bending means is illustrated.

BEST MODE FOR CARRYING OUT THE INVENTION

Figure 5:
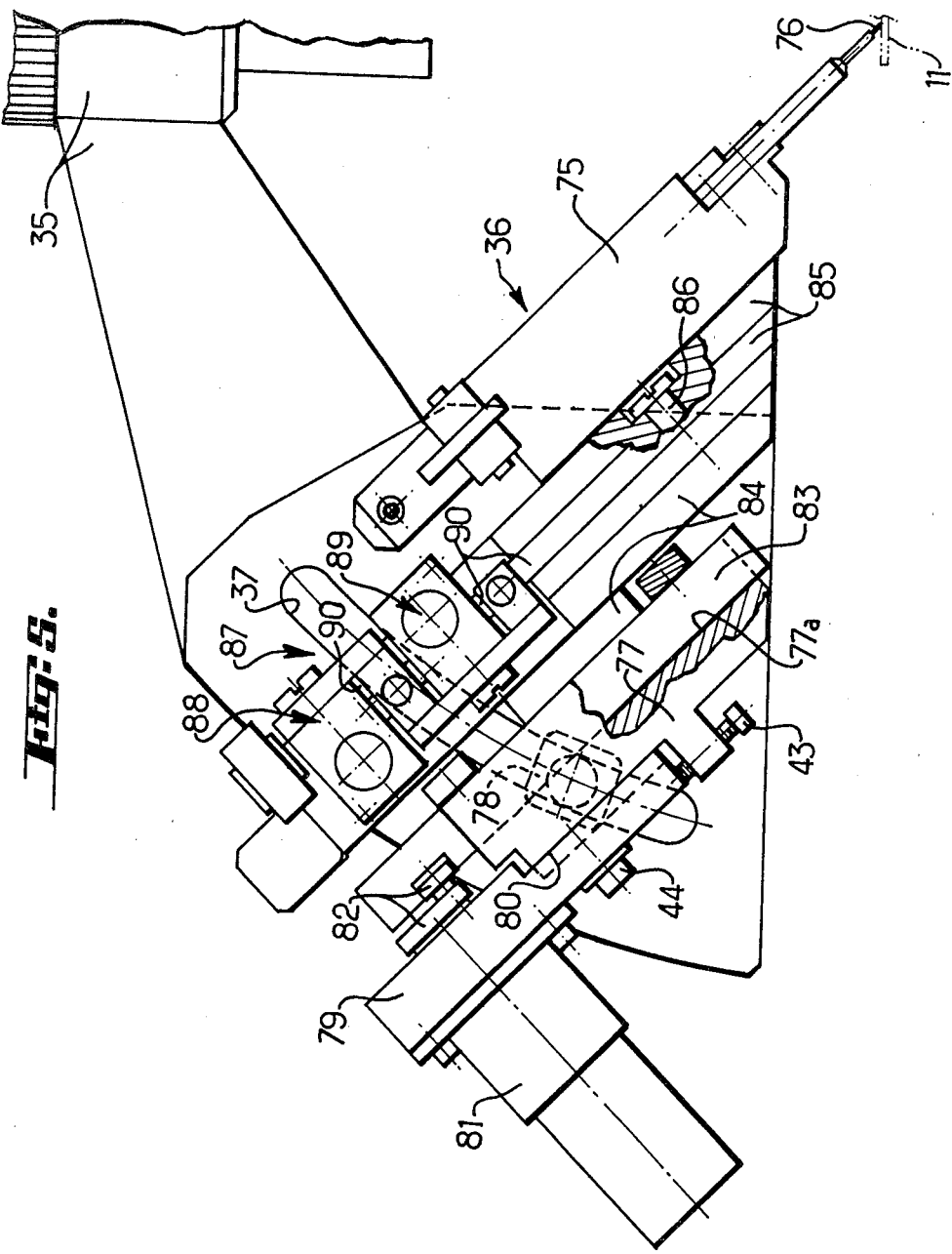
FIG. 5 is a partial view of a pivoting substrate carrier wherein means for securing the wire on a substrate carrying components is particularly illustrated.

Reference is now made to FIG. 1 of the drawing wherein there is illustrated a conventional printed circuit 12 containing a plurality of openings 13, in each of which is fixedly mounted a substrate. In a central opening of the printed circuit 12, substrate 11 is mounted and includes a predetermined number of integrated circuits and, if appropriate, other components, such as capacitors. Substrate 11 is assumed to be previously wired, whereby printed circuit conductors extend between integrated circuits 14 and the other components thereon. Because substrate 11 has been previously wired, it is more difficult to apply a complementary wiring system to the surface of substrate 11. The present invention is particularly applicable to an apparatus for applying a complementary wiring system on the surface of a previously wired substrate. It is also particularly applicable to application of wires to a bare substrate, i.e., a substrate to which wires have not been previously applied.

The apparatus illustrated in FIG. 1 generally includes a tool carrier 15 and a substrate carrier 16 on which is fixedly mounted printed circuit 12. Substrate carrier 16 includes means for positioning printed circuit 12 and substrate 11 in a horizontal plane such that the substrate and printed circuit may be displaced to any required position below tool carrier 15. In generalized terms, tool carrier 15 and/or substrate carrier 16 are coupled to at least one mechanism for translatory and/or rotary displacement between substrate 11 and tools carried by carrier 15.

In the illustrated, preferred embodiment, substrate carrier 16 includes an X-Y table 17 on which are installed positioning wedges and stops described infra. Tool carrier 15 is in the general shape of a bracket to which is attached a leg 18 having a telescoping structure enabling the distance between the ends of tools mounted on carrier 15 and the surface of the substrate 11 to be varied.

The bracket forming tool carrier 15 includes a substantially horizontal section 19 and a substantially vertical section 20, which together form the elements of a vertical slideway 21, which enables section 19 to be raised and lowered. Section 19 is vertically driven by electric motor 22, which is coupled to lower extension 26 of the horizontal section through reduction gear 23 and cam 24 that acts on roller 25 which is attached to the lower section. At the opposite end of horizontal section 19, above X-Y table 17, at least two tools that operate on substrate 11 are mounted. In the particular embodiment illustrated in FIG. 1, one of the tools is a heating bit or element 30, while the second tool is an electric wire dispenser 31 having a wire output orifice 32 situated at the lower end of heating bit 30.

Heating bit 30 is vertically displacable by being longitudinally translated inside of sleeve 33, having a longitudinal axis directed toward substrate carrier 16, enabling bit 30 to be lowered into contact with substrate 11 to form a soldering operation at a point on the substrate determined by the initial position of X-Y table 17. Wire dispenser 31 is mounted on a rotary support 35, coaxial with sleeve 33 and rotatable about the sleeve, to enable output orifice 32 to be positioned with respect to the end of heating bit 30, as a function of the direction of relative displacement between tool carrier 15 and substrate carrier 16 while X-Y table 17 is in motion.

Rotary support 35 carries a securing device 36 which enables wire payed from dispenser 31 to adhere to substrate 11 in synchronism and at the rate the wire is deposited on the substrate. Securing device 36 is angularly adjustable in a vertical plane as a result of being mounted in arcuate slot 37 in rotary support 35; securing device 36 is described in detail infra. Wire dispenser 31 can also be angularly adjusted in a vertical plane since it is carried by arcuate slot 38, formed in rotary support 35. Thereby, wire dispenser 31 and securing device 36 may be mounted in two preferential angular positions with respect to the vertical; these angular positions correspond to inclinations of the lower extremities of dispenser 31 and securing device 36 of respectively 15° and 45° with respect to the axis of sleeve 33. For clarity of the drawings, securing device 36 and dispenser 15 have been respectively illustrated in FIG. 1 at 45° and 15°, as denoted by the dotted lines; it is to be understood that the illustrated situation does not correspond to the normal mode of operation. The 45° inclination of dispenser 31 relative to the axis of sleeve 33 insures satisfactory unwinding of electric wire from the dispenser onto bare substrates, but it has been found that this angle is not usually satisfactory on previously wired substrates. For previously wired substrates, and in particular substrates which are installed on printed circuits having apertures, the normal operating position for wire dispenser 31, as well as for securing device 36, is actually 15°. It has been found that the 15° angle for dispenser 31 and securing device 36 enables the extremities of tools in tool carrier 15 to pass as close as possible to components installed on substrate 11, if this is necessary.

Rotary support 35 is rotatably driven by an external pinion 40, which is coupled to toothed belt 41, in turn driven by electric motor 42, fixedly mounted on horizontal section 19 of tool carrier 15. The upper part of heating bit 30 is connected via a hinged connection 45 to a lever arm 46, having an intermediate point pivotably mounted to horizontally extending pivot pin 47 on tool carrier 15. The end of arm 46 remote from hinged connection 45 carries an adjustable counterweight system 48, which enables the force that heating bit 30 exerts on substrate 11 to be varied.

Reference is now made to FIGS. 2 and 3 of the drawings wherein details of heating bit 30 are illustrated in combination with rotary support 35 and a drive system for the heating bit. The upper part of heating bit 30 is vertically slidable within sleeve 33 through two ball-bearing bushings 50. Rotary support 35 includes a hub 51 that is coaxial with the longitudinal axis of bit 30 and sleeve 33 and is coupled to the outer diameter of the sleeve by a pair of ball-bearings 52. Heating bit 30 is coupled to lever arm 46 via hinged connection 45, whereby pivoting of arm 46 about pivot pin 47 in response to rotation of cam 53 results in raising and lowering of the heating bit.

Adjustable counterweight system 48, which controls the force applied by heating bit 30 to substrate 11, includes a weight 55 that is slidable along the length of arm 46 by a guide including rods 56 (FIG. 3) that fit into grooves in the weight. Rods 56 prevent rotation of weight 55 when the weight is longitudinally translated by threaded rod 57 which extends through a centrally located bore of weight 55. Electric motor 58 includes a drive spindle connected to one end of screw-threaded rod 57, to rotate the rod and provide for the longitudinal displacement of weight 55 along arm 46. It is thereby possible to adjust the bearing force with which the end of heating bit 30 rests on substrate 11 during a soldering operation.

In the type of soldering application contemplated, a solder spot, for example, of lead-indium, previously deposited on substrate 11 is remelted. For such applications, weight 55 is positioned at a first predetermined position. For other applications, wherein it is necessary to solder differing numbers of wires, as many as three, to a single solder spot on substrate 11, the position of weight 55 is changed. In particular, the bearing force at the end of bit 30 on a solder spot must increase as the number of wires to be soldered to the same spot increases. Because the different bearing forces for differing numbers of wires are predetermined, several preferred positions of weight 55 along arm 46 are established. Each preferred position corresponds to the contact force required to solder first, second or third wires to a given solder spot. To contol the position of weight 55 to the preferred positions, a permanent magnet 60 is mounted on weight 55 and a number of magnetic field sensing elements 61 are positioned at predetermined locations along the length of arm 46. The detector elements, typically reed switches, include contacts connected to an electronic control system (not shown) for motor 58, to form a positive positional control system for the motor. Motor 58 is installed on arm 46 centrally between the ends of the arm, in proximity to pivot pin 47.

Reference is now made to FIG. 4 of the drawing wherein there is illustrated in greater detail the structure of substrate carrier 16. Fixedly mounted on X-Y table 17 is a square base 65 including four downwardly extending corner feet 66 on which bear all four corners of substrate 11. Two of the feet bear the reference numeral 66, while the upper right and upper left feet, as illustrated in FIG. 4, bear the reference numerals 66a and 66b, respectively. At the top of foot 66a is an angle-piece 67, cut from the body of foot 66a, which functions as a locator for the position of substrate 11. Foot 66b includes a stop having an interior surface in the same plane as a part of angle-piece 67. Blade or leaf springs 69 are fixedly mounted on the interior of a pair of adjacent edges of base 65 to bear against corresponding edges of substrate 11, to hold the substrate in contact against angle-piece 67 and stop 68; the edges of base 65 on which springs 69 are mounted are opposite and complementary to feet 66a and 66b. Base 65 is mounted on X-Y table 17 by a vertical pin 70 to provide angular adjustment of substrate 11 relative to the table. The angular adjustment is provided by rotating base 65 about pin 70, which is centrally located relative to the base, in response to adjustment of micrometer 71, positioned between base 65 and X-Y table 17. If substrate 11 is bare, i.e., has no wiring on it, the substrate position is adjusted by merely rotating base 65. If, however, the substrate has been previously wired and installed in printed circuit 12, including apertures 13 (FIG. 1), it is necessary to mount in base 65 that substrate 11 containing wires that are to be resoldered. In such an instance, the remaining part of printed circuit 12 is supported by removable stop 74 (FIG. 1) fixedly mounted on table 17 and projecting upwardly from it.

Reference is now made to FIG. 5 of the drawing wherein securing device 36 is illustrated in greater detail. Securing device 36 includes a type of syringe 75 having a needle 76 that is positioned in proximity to outlet orifice 32 of wire dispenser 31 (FIG. 2), on the other side of heating bit 30. Syringe 75 includes a vial for a quick-drying glue which is dispensed in response to pulses from a controlled pressure source (not shown). Each time the pressure source supplies a pressure pulse to the vial of syringe 75, a drop of glue escapes from needle 76. The drop of glue secures wire applied to substrate 11 by orifice 32 of dispenser 31 because the glue is set simultaneously on the wire and substrate. The pulsed pressure source is preferably arranged so that between a pair of adjacent positive pressure pulses supplied to the glue containing vial, a slightly lower than atmospheric pressure is applied to the vial, to maintain the glue wholly within the vial and needle 76. Thereby, premature drying and clogging of the internal passage of needle is obviated. Needle 76 can be positioned at angular settings of 15° and 45° with respect to the longitudinal axis of heating bit 30. In addition, needle 76 can be withdrawn along the longitudinal axis thereof and can be laterally deflected, for a special wiring operation, described infra.

The structure for longitudinally displacing needle 76 along the longitudinal axis thereof is provided by a structure including arcuate slot 37 in securing device 36. Support member 77 is angularly positioned in slot 37 and held in situ by clamping device 78, to enable the position of needle 76 to be set at 15° or 45° relative to the axis of heating bit 30. Support member 77 and a second support member 79 have abutting faces that form a slideway 80 and which couples the two support members together. Support member 79 carries an electric motor 81 having a spindle connected to eccentric roller 82 that is captured in a cavity of support member 77. The relative position between support member 77 and support member 79 is determined by adjusting screw 43 which is screwed into a threaded bore in a boss of support member 77 and has an end abutting against a face of support member 79. Turning of screw 43 establishes the relative position between support members 77 and 79. Slideway 80 is locked by screw 44, that extends through a bore in support member 79 into a threaded bore in support member 77; the longitudinal axis of screw 44 is transverse with respect to slideway 80 and the longitudinal axis of screw 43, enabling members 77 and 79 to be locked together in normal operation. The relative position between support members 77 and 79 is adjustable to control the position of the tip of needle 76 with respect to substrate 11. Eccentric roller 82 is captured in a cavity of bar 83 so that it slidably drives the bar in slideway 77a of abutting faces between support member 77 and bar 83. Fixedly mounted to bar 83 is base 84, which is displacably withdrawn in the same manner as bar 83, when the bar is impelled by eccentric roller 82, in turn driven by motor 81. Base 85, which carries syringe 75, is selectively pivotably mounted on base 84 by virtue of pin 86 extending vertically through a bore in support 85 into a threaded bore in base 84. In response to pivoting displacement of support 85 relative to pin 86, the end of needle 76 can be angularly offset from its normal position, to either side. The angular offset of the end of needle 76 is adjusted to provide for a lateral deflection of the end of the needle, by approximately ±0.5 millimeters with respect to a normal, central position for the needle. Syringe 75 is pivotably displaced by an electro-mechanical control system 87 including a pair of electromagnets 88 and 89, between which is positioned a high magnetic permeability extension 90 that is fixedly mounted on support 85. Selective activation of electromagnets 88 and 89 rotatably drives syringe 75 in opposite directions.

As previously stated, syringe 75 is particularly applicable to dispense glue for wiring operations performed on a previously wired substrate having active and/or passive components mounted thereon. Conversely, if the substrate has not been previously wired, a modified securing structure can be utilized because it is then possible to deposit a film of thermo-reactive glue directly on the surface of the substrate. In such an instance, the device for securing the wire to the substrate which is installed on tool carrier 15 is preferably formed by a simple device for discharging hot air, instead of gluing syringe 75. The film of thermo-reactive glue is applied to the substrate prior to application of wire to the substrate. The deposited film of thermo-reactive glue is locally softened on substrate 11, in close proximity to orifice 32 of wire dispenser 31, in such a manner that the wire applied to the substrate by the dispenser may be encrusted into the glue throughout its length. This is in contrast to wire which is secured in place by syringe 75, which applies spaced drops to the wire. The thermo-reactive glue also may be applied directly to the wire which is applied to the substrate by dispenser 31. In this case, the wire is heated after being applied to the substrate by the hot air discharge.

Figure 6:
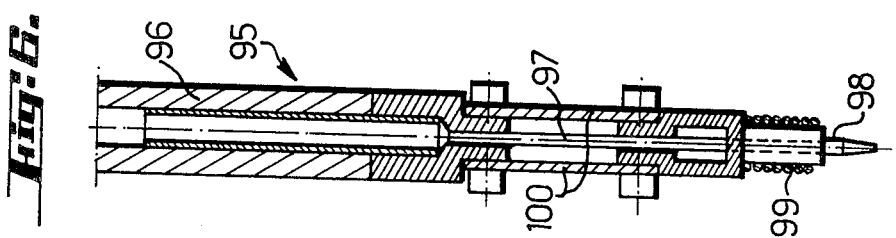
FIG. 6 is a diagrammatical view in cross-section of a variation of a part of the securing means of FIG. 5 particularly applicable to a substrate that is not carrying any components.

Reference is now made to FIG. 6 of the drawing wherein there is illustrated an apparatus for applying a hot air discharge to a film of thermo-reactive glue which has been applied to the substrate, either directly to the substrate or to wire on the substrate. The structure of FIG. 6 is used in place of the syringe 75, specifically illustrated in FIG. 5. The hot air applicator subassembly 95 of FIG. 6 includes an upper tubular end 96 having a central, longitudinally extending bore in fluid flow relation with an air supply source. Air from the source flows through the bore in tube 96 to a narrower bore 97, at the lower end of the tube. Narrow tube 97 terminates in an air discharge nozzle 98. A portion of tube 96 immediately above nozzle 98 is encircled by an electric heating resistance 99, to heat the air flowing through nozzle 98 immediately prior to discharge of the air from the nozzle. Heat insulating panels 100 surround tube 96 above nozzle 98 and heater 99 to prevent conduction heat losses. If nozzle 98 were connected directly to a source of hot air, electric heating resistance 99 could be omitted. Of course, is it to be understood that the structure illustrated in FIG. 6 is substituted for syringe 75 and is thereby mounted on rotary support 35 opposite from wire dispenser 31.

Figure 7:
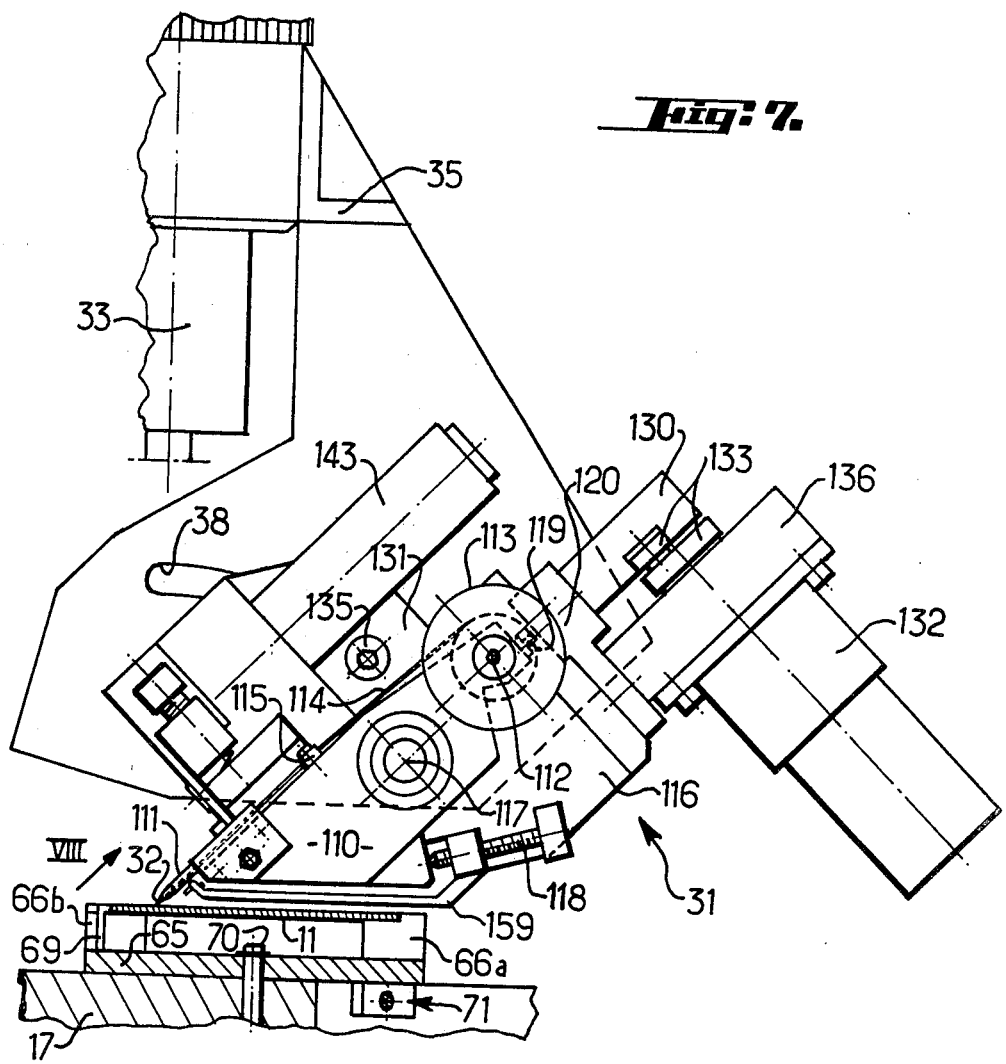
FIG. 7 is a partial view to enlarged scale of a part of a rotary support on which a wire dispenser is installed.
Figure 8:
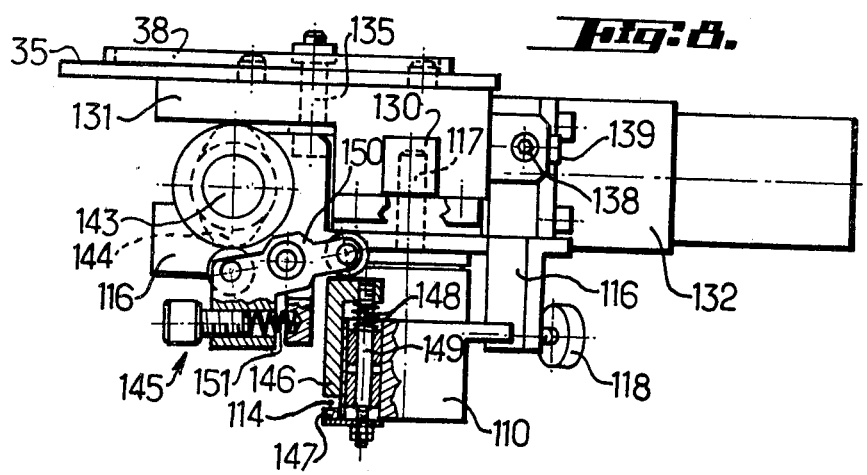
FIG. 8 is a view according to the arrow VIII—VIII of FIG. 7.

Reference is now made to FIGS. 7 and 8 of the drawing, detailed diagrams of wire dispenser 31 carried on the part of rotary support 35 opposite from the securing device of FIG. 5 or 6. Wire dispenser 31 includes a base 110 on which is mounted a wire guiding tube 111, having a tapered lower portion that forms wire outlet orifice 32. Wire dispenser 31 also includes a spindle 112, having a longitudinal axis transverse to the longitudinal axis of guiding tube 111 and spaced from the guiding tube. Wire reel 113 is mounted for substantially free rotation on spindle 112, by virtue of a ball-bearing connection between them. In certain instances, it may be necessary to provide a static, frictional braking system, such as a felt liner, to maintain a suitable tension on the wire payed from reel 113.

When the system illustrated in FIGS. 7 and 8 is in operation, the wire 114 payed from reel 113 initially engages guiding element 115, thence passes through guiding tube 111 to outlet orifice 32 of wire dispenser 31, to enable the wire to be deposited on substrate 11 as it emerges from the orifice. Base 110 is pivotably mounted by pin 117 on an intermediate support member 116, which forms a part of rotary support 35. Base 110 is mounted on support member 116 at right angles to the general plane of base 110 in such a manner that the base can freely rotate, at least within a limited angular sector. To this end, an adjustable stop screw 118 is positioned between base 110 and intermediate support member 116 to establish the relative angular positions between them in normal operation. Screw 118 is threaded into a threaded bore on a boss of intermediate member 116 and includes an end that bears against a lateral part of base 110. Pivot pin 117 is positioned in such a manner that base 110 normally abuts against the end of screw 118 because of the force of gravity on the weight of the base. Consequently, base 110 may pivot clockwise, as illustrated in FIG. 7, to enable automatic clearing of orifice 32 if the orifice contacts a projecting element or obstacle on the surface of substrate 11; such a projecting element or obstacle may be a solder terminal or a previously applied wire on the substrate.

If the obstacle encountered by orifice 32 has a larger size than a solder terminal or a previously laid wire, such as an integrated circuit or a capacitor, a handling mistake of the apparatus has occurred and it is desired to deactivate movement of X-Y table 17. To this end, pivoting base 110 detects contact between orifice 32 and a component, such as an integrated circuit or capacitor, on substrate 11, to derive a signal to interrupt the displacement of table 17. Pivoting of base 110 in response to such a relatively large obstacle being encountered by orifice 32 is detected by mounting a permanent magnet 119 to the base. Permanent magnet 119 is normally positioned opposite a magnetic field detector, such as reed switch 120. If excessive pivotable displacement of base 110 occurs, magnet 119 is appreciably displaced with respect to reed switch 120, whereby the reed switch derives a signal which is supplied to an electronic processing and control system (not shown) which prevents the further displacement of X-Y table 17. Base 110 is easily removed from an encountered component on substrate 11 merely by unthreading pivot pin 117.

Reference is now made to FIG. 9 of the drawing wherein a part of wire dispenser 31 is illustrated, such that base 110 is removed. A guide means for dispenser 31 is formed by a slideway between abutting faces of base 110 and rotary support 35. The guide between base 110 and rotary support 35 enables base 110 to be displaced in a direction parallel to the longitudinal direction of guiding tube 111, to enable the base to be withdrawn. To this end, intermediate support member 116 is attached to a bar 130 (see FIGS. 7 and 8) that forms part of the guide between base 110 and rotary support 35. Intermediate support member 116 is arranged to be slidable longitudinally in support member 131 that forms the other part of the guide between base 110 and rotary support 35.

Control for the guide between base 110 and rotary support 35 includes electric motor 132, having an output shaft coupled to eccentric roller 133, captured in a cavity toward one end of bar 130. The assembly including bar 130 and supporting element 131 is connected to the remainder of rotary support 35 by way of manually adjustable angular positioning means including arcuate slot 38 and clamping member 135, which rides in the arcuate slot. Clamping member 135 makes it possible to lock supporting element 131 manually to rotary support 35 at an angular position with respect to opening 38 that is determined by the position of clamping member 135. As indicated supra, adjustment of the angular position enables the axis of guiding tube 111 to be 15° or 45° with respect to the vertical axis of heating bit 30, depending on whether operations are being performed on a previously wired or bare substrate. To provide an initial adjustment for guiding tube 111, motor 132 is fixedly mounted on support member 136, having an abutting face with supporting member 131, to form a slideway between the two supporting members. The relative position between supporting members 131 and 136 is set by adjusting screw 138. When the wire contacts the solder spot on substrate 11 to which it is to be soldered, syringe 75 is withdrawn and the heating bit 30 is then lowered into contact with substrate 11. Electric current is applied to heating bit 30 to solder the wire to the spot. Wire 114 is then severed by driving clamping element 146 toward clamping element 147, while the assembly comprising base 110, intermediate support member 116 and bar 130, is withdrawn. After the assembly including base 110, intermediate support member 116 and bar 130 has been withdrawn, bending device 158 comprising lever 159 and weight 160 (FIG. 10) is released by retracting the end of guiding tube 111. Retracting the end of guiding tube 111 automatically places the free end of wire 114 into a horizontal position, to enable another soldering operation to be performed. Wire 114 is gripped by elements 146 and 147 while the next spot and heating bit 31 are aligned by movement of X-Y table 17. The assembly including base 110, intermediate support member 116 and bar 130 is displaced back to the lower position, so wire 114 is brought into contact with the next selected soldering spot. The wire is soldered to the next spot by applying current to heating element 30 after the heating element has been lowered to the spot. After the soldering operation has been performed, clamping elements 146 and 147 are urged apart in response to the action of cam 144 on lever 150. After clamping elements 146 and 147 have been urged apart, X-Y table 17 is driven so that wire 114 is unwound from reel 113. The motion of wire 114 follows the motion of X-Y table 17 because the wire is secured, by a gluing action, to the substrate. The wire 114 thus moves along the substrate toward another soldering spot. The same sequence is repeated at the another soldering spot.

It is to be understood that when the described apparatus is operating in connection with a bare substrate, dispenser 31 and securing device 36 are reset at 45° with respect to the vertical and syringe 75 is replaced by a hot air dicharge device, as illustrated in FIG. 6.

While there have been described and illustrated several specific embodiments of the invention, it will be clear that variations in the details of the embodiments specifically illustrated and described may be made without departing from the true spirit and scope of the invention as defined in the appended claims.

We claim:

1. Apparatus for wiring on the surface of a substrate comprising a tool carrier, a substrate carrier, means for positioning the substrate carrier in a substantially horizontal plane so it is situated opposite the tool carrier, means for displacing the substrate carrier relative to the tool carrier so the tool carrier is displaceable relative to a vertical plane, a heating element and an electric wire dispenser carried by the tool carrier, said dispenser including a wire outlet orifice situated close to an end of the heating element, means for translating the heating element longitudinally within a sleeve having an axis directed towards the substrate carrier, and a rotary support for carrying the dispenser, said rotary support being rotatable around the sleeve axis to allow the said wire outlet orifice to be positioned with respect to an end of the heating element as a function of the direction of the relative displacement between the substrate carrier and tool carrier.

2. The apparatus of claim 1 wherein said tool carrier includes a device for securing wire from the outlet to the substrate, said wire securing device being carried by the said rotary support.

3. The apparatus of claim 2 wherein said securing device includes a syringe having a needle positioned close to the wire orifice, said syringe including a vial adapted to contain a quick-drying glue.

4. The apparatus of claim 3 further including a pivotable base on which said syringe is mounted, a pin at right angles to the direction of the syringe needle situated in a plane substantially at right angles to the plane of the substrate while the substrate is positioned on the said substrate carrier for selectively laterally deflecting the pivotable base to either side of a normal position.

5. The apparatus of claim 2 wherein at least one of the substrate and the wire is coated externally with a film of thermo-regenerable adhesive, the securing device including a discharge nozzle for hot air, the orifice of the said discharge nozzle being positioned close to the said outlet orifice for the wire from the said dispenser.

6. The apparatus of claim 5 further including heating means in the nozzle to provide the hot air discharge.

7. The apparatus of claim 5 further including a hot air source upstream of the nozzle to provide the hot air discharge.

8. The apparatus of claim 2 or 5 further including a manually adjustable angular positioning device connecting the securing device to the remainder of the rotary support for adjusting an inclination angle of the wire securing device with respect to the plane of said substrate.

9. The apparatus of claim 8 wherein the angular positioning device includes a clamping element cooperating with an arcuate opening of the rotary support.

10. The apparatus of claim 1 further including an arm forming a lever rockingly mounted on the tool carrier at an intermediate point along the length of the arm, an articulated coupling for connecting the heating element to the arm, an adjustable counterweight system for varying the bearing contact force of the heating bit on the substrate mounted on a part of the arm situated at a side from the said intermediate point opposite to the articulated coupling.

11. The apparatus of claim 10 wherein the counterweight system comprises a screw-threaded rod positioned parallel to the arm, a weight guided positively along the arm and screwed on the rod, and an electric motor having a driving shaft mechanically coupled to one end of the screw-threaded rod.

12. The apparatus of claim 11 wherein the motor is mounted on the arm forming the lever in proximity to the intermediate point.

13. The apparatus of claim 2, 3, 4, 5, 6 or 7 further including an arm forming a lever rockingly mounted on the tool carrier at an intermediate point along the length of the arm, an articulated coupling for connecting the heating element to the arm, an adjustable counterweight system for varying the bearing contact force of the heating bit on the substrate mounted on a part of the arm situated at a side from the said intermediate point opposite to the articulated coupling.

14. The apparatus of claim 1 wherein the dispenser comprises a selectively removable base, mounted on the rotary support and on which are mounted:
   a guiding tube having a constricted orifice which forms the wire outlet orifice,
   a shaft transverse to a longitudinal axis of the guiding tube, said shaft being relatively remote from the tube, and
   a wire reel mounted for substantially free rotation on the shaft; the reel, guiding tube and substrate carrier being positioned so the wire from the reel is adapted to pass through the guiding tube before being deposited onto the said substrate as the wire emerges from the wire outlet orifice.

15. The apparatus of claim 14 further including a wire bending device articulated on the rotary support, said wire device being movable in a path so at least a part of the bending device passes in close proximity to the wire outlet orifice.

16. The apparatus of claim 15 wherein the bending device comprises a weight and a lever attached to the weight, said lever being substantially at right angles to the weight, said bending device being freely articulated to a part of the rotary support separate from the said base, the wire outlet orifice being movable by the withdrawal displacement of the base in the said guiding devices in a path so the orifice encounters the lever.

17. The apparatus of claim 14 wherein the base and the said rotary support comprise cooperating guiding devices enabling a withdrawal displacement from the base, and further comprising a controlled actuation device connected to the guiding devices to provide the withdrawal displacement of the base along a predetermined direction.

18. The apparatus of claim 17 wherein the predetermined direction is substantially parallel to the longitudinal direction of the wire guiding tube.

19. The apparatus of claim 18 wherein the locking mechanism comprises two clamping elements having planar and polished faces, at least one of the elements being movable in a direction towards the other element, an actuating device coupled to the elements for displacing them relative to each other, the wire normally being located in a gap separating the faces.

20. The apparatus of claim 19 wherein the clamping elements are positioned on the base between the rotary support and the wire guiding tube.

21. The apparatus of claim 17 further including a controlled wire locking mechanism mounted on the rotary support.

22. The apparatus of claim 17 wherein the base is mounted by a shaft on an intermediate member of the rotary support, said shaft being at right angles to the plane of the base, the base being mounted so that it can freely rotate within a limited angular sector.

23. The apparatus of claim 22, further including an adjustable screw stop positioned between the base and the intermediate member.

24. The apparatus of claim 17, 21, 19, 22 or 23 further including a wire bending device articulated on the rotary support, said wire device being movable in a path so at least a part of the bending device passes in close proximity to the wire outlet orifice.

25. The apparatus of claim 17 wherein the cooperating guiding devices define an assembly connected to the rotary support by a manually adjustable angular positioning device.

26. The apparatus of claim 25 wherein the angular positioning device comprises a clamping element cooperating with an arcuate opening of said rotary support for enabling the inclination of the wire guiding tube to be adjusted with respect to the plane of the substrate.

27. The apparatus of claim 21, 19, 22, 23, 15 or 16 wherein the cooperating guiding devices define an assembly connected to the rotary support by a manually adjustable angular positioning device.

28. The apparatus of claim 1 wherein the substrate carrier device comprises positioning clamps and stops installed on a X-Y table.

29. The apparatus of claim 28 wherein the positioning clamps and stops are carried by an intermediate base pivotally mounted on a vertical spindle, a micrometric adjustment mechanism for enabling an angular positioning correction to be provided between the intermediate support and the said X-Y table.

30. The apparatus of claim 2, 3, 4, 5, 10, 11, 12, 14, 17, 21, 19, 22, 23, 15, 16 or 25, wherein the substrate carrier device comprises positioning clamps and stops installed on a X-Y table.

31. The apparatus of claim 1 further comprising a telescopic structure mounted on a foot of the bracket for varying the distance between the ends of the tools and a surface of the substrate onto which the wire is to be deposited.

32. The apparatus of claim 2, 3, 4, 5, 10, 11, 12, 14, 17, 21, 19, 22, 23, 15, 16, 25, 28 or 29 further comprising a telescopic structure mounted on a foot of the bracket for varying the distance between the ends of the tools and a surface of the substrate onto which the wire is to be deposited.

33. Apparatus for modifying and/or completing a printed circuit board that carries a substrate comprising a tool carrier, a substrate carrier, the tool carrier being displaceable relative to a plane at right angles to the surface of the substrate carrier, the tool carrier including a heating element and a dispenser for electric wire that is applied to at least one of the substrate and the board, the wire dispenser including an orifice situated close to the end of the heating element, means for selectively urging the orifice into proximity to the substrate carrier, a sleeve through which the heating element is longitudinally displaceable, the sleeve having an axis directed toward the substrate carrier, the dispenser being rotatably mounted around the sleeve axis to allow the wire orifice to be positioned with respect to the end of the heating element, and means for mechanically coupling the tool carrier and the substrate carrier to each other so that the wire orifice is positioned with respect to the end of the heating element as a function of the displacement direction between the tool carrier and substrate.

* * * * *